(12) United States Patent
Lin

(10) Patent No.: US 6,976,525 B2
(45) Date of Patent: Dec. 20, 2005

(54) FASTENING DEVICE FOR A RADIATOR

(75) Inventor: Hsin-Cheng Lin, Kaohsiung (TW)

(73) Assignee: Asia Vital Component Co., Ltd., Kaohsiung (TW)

(*) Notice: Subject to any disclaimer, the term of this patent is extended or adjusted under 35 U.S.C. 154(b) by 0 days.

(21) Appl. No.: 10/784,284

(22) Filed: Feb. 24, 2004

(65) Prior Publication Data

US 2005/0183842 A1 Aug. 25, 2005

(51) Int. Cl.[7] .................................. H05K 7/20
(52) U.S. Cl. .................. 165/80.3; 361/704; 257/719
(58) Field of Search ..................... 165/80.2, 80.3, 165/185; 361/704; 257/719

(56) References Cited

U.S. PATENT DOCUMENTS

| | | | | |
|---|---|---|---|---|
| 2,305,122 A | * | 12/1942 | Wiley | 52/466 |
| 4,712,159 A | * | 12/1987 | Clemens | 361/717 |
| RE35,573 E | * | 7/1997 | Clemens | 257/719 |
| 5,730,210 A | * | 3/1998 | Kou | 165/80.3 |
| 6,037,660 A | * | 3/2000 | Liu | 257/722 |
| 6,049,459 A | * | 4/2000 | Edmonds et al. | 361/707 |
| 6,105,215 A | * | 8/2000 | Lee | 24/458 |
| 6,307,748 B1 | * | 10/2001 | Lin et al. | 361/704 |
| 6,625,022 B2 | * | 9/2003 | Frutschy et al. | 361/700 |
| 6,646,881 B1 | * | 11/2003 | Lai et al. | 361/719 |
| 6,795,317 B1 | * | 9/2004 | Liu | 361/704 |

* cited by examiner

Primary Examiner—Allen J. Flanigan

(57) ABSTRACT

A radiator with a securing device for cooling the heat generating unit, which is attached to a base plate. The securing device basically is a locating part with a locating opening and disposed beneath the radiator to support and locate the radiator. There are secure arms with fixing holes extending radially from the locating part for being fastened to the base plate.

1 Claim, 4 Drawing Sheets

FASTENING DEVICE FOR A RADIATOR

BACKGROUND OF THE INVENTION

1. Field of the Invention

The present invention relates to a radiator with a securing device and particularly to a securing device, with which the radiator can keep closely contact with a heat-generating part on a circuit board.

2. Brief Description of Related Art

The central processing unit (CPU) has been designed to provide extremely fast operation speed and, under this circumstance, it results in much more heat being created. Hence, in order to avoid high heat affecting normal operation of the CPU, a more efficient cooling device is required for heat dissipation.

The conventional cooling device usually includes a radiator, a cooling fan and a securing device. The cooling fan is disposed on the radiator to induce airflow for convection. The securing device is used to allow the radiator being fixedly attached to the CPU.

Taiwanese Patent Official Gazette No. 562158, entitled "fixing device for cooling fins being joined to a CPU", includes a frame base, a lower plate and a fixing piece. The frame base has a rectangular shape to be disposed on the main board such that the cooling fins can contact the surface of the CPU. The lower plate is disposed beneath the CPU with two posts thereof piercing both the main board and the frame base. The fixing piece is disposed on the cooling fins with two ends thereof engages with the two posts with a screw rod respectively.

However, in order to locate the fixing device of the preceding prior art, a groove has to be provided such that the structure and shape of the radiator is restricted by the fixing device and the cooling area of the radiator is limited. As a result, the heat dissipation efficiency is incapable of being promoted.

Referring to FIGS. 1 and 2, another conventional cooling device has a radiator 11 mounted to a base plate 12 with a CPU 13 thereon and the radiator 11 has a locating lug with a through hole 112 at each of four lateral sides of the radiator 11 such the radiator 11 is secured to the base plate 12 by means of all the through holes 112 corresponding to the fixing holes 121 in the base plate 12 and being passed through with screws 141 and a spring 142 being disposed around the screws 141 respectively. Hence, the radiator 11 can keep contact with the CPU 13 against resilient bias force of the spring 142. It can be seen that the spring 142 is pressed between the head of the screw 141 and the locating lug to prevent the engaging holes 112 and the base plate 12 from damage due to excessive fastening force exerting to the screw 141 and prevent the CPU 13 from damage due to the radiator 11 excessively squeezing the CPU 13.

But, a problem of the preceding prior art resides in that the screws 141 and the springs 142 are separately packed while being delivered so that the screws 141 and the springs 142 are easy missing during mounting the radiator 11 to the base plate 12. Moreover, the springs 142 in addition to the screws 141 makes the overall production cost and set-up cost high.

SUMMARY OF THE INVENTION

An object of the present invention is to provide a radiator with a securing device in which the secure device has less components and a locating part thereof has been tempered with heat treatment so that a resilient force can be obtained while the locating part is fastened to the base plate.

BRIEF DESCRIPTION OF THE INVENTION

The detail structure, the applied principle, the function and the effectiveness of the present invention can be more fully understood with reference to the following description and accompanying drawings, in which.

DETAILED DESCRIPTION OF THE INVENTION

Figure 1:
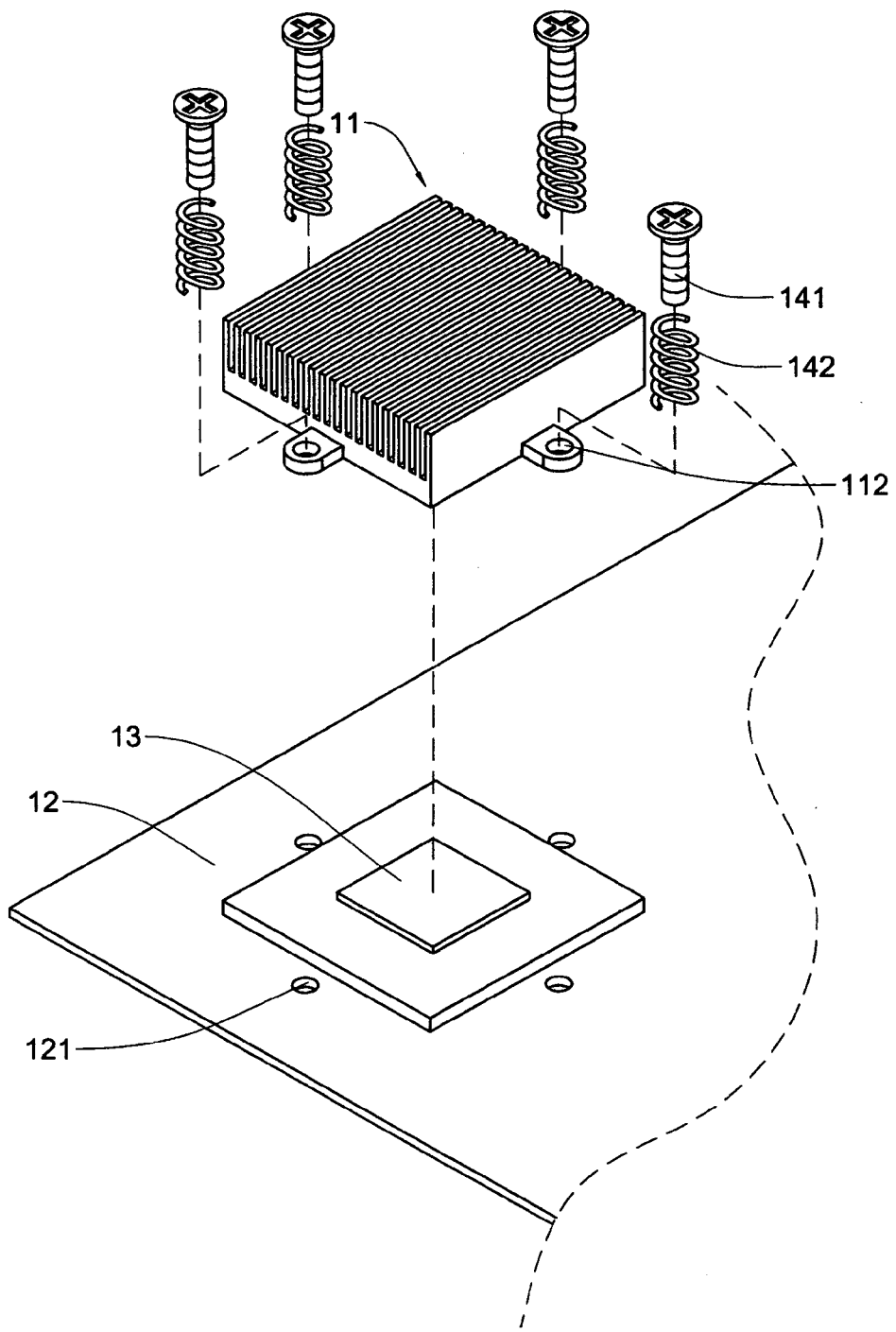
FIG. 1 is a disassembled perspective view of the conventional radiator with a securing device.
Figure 2:
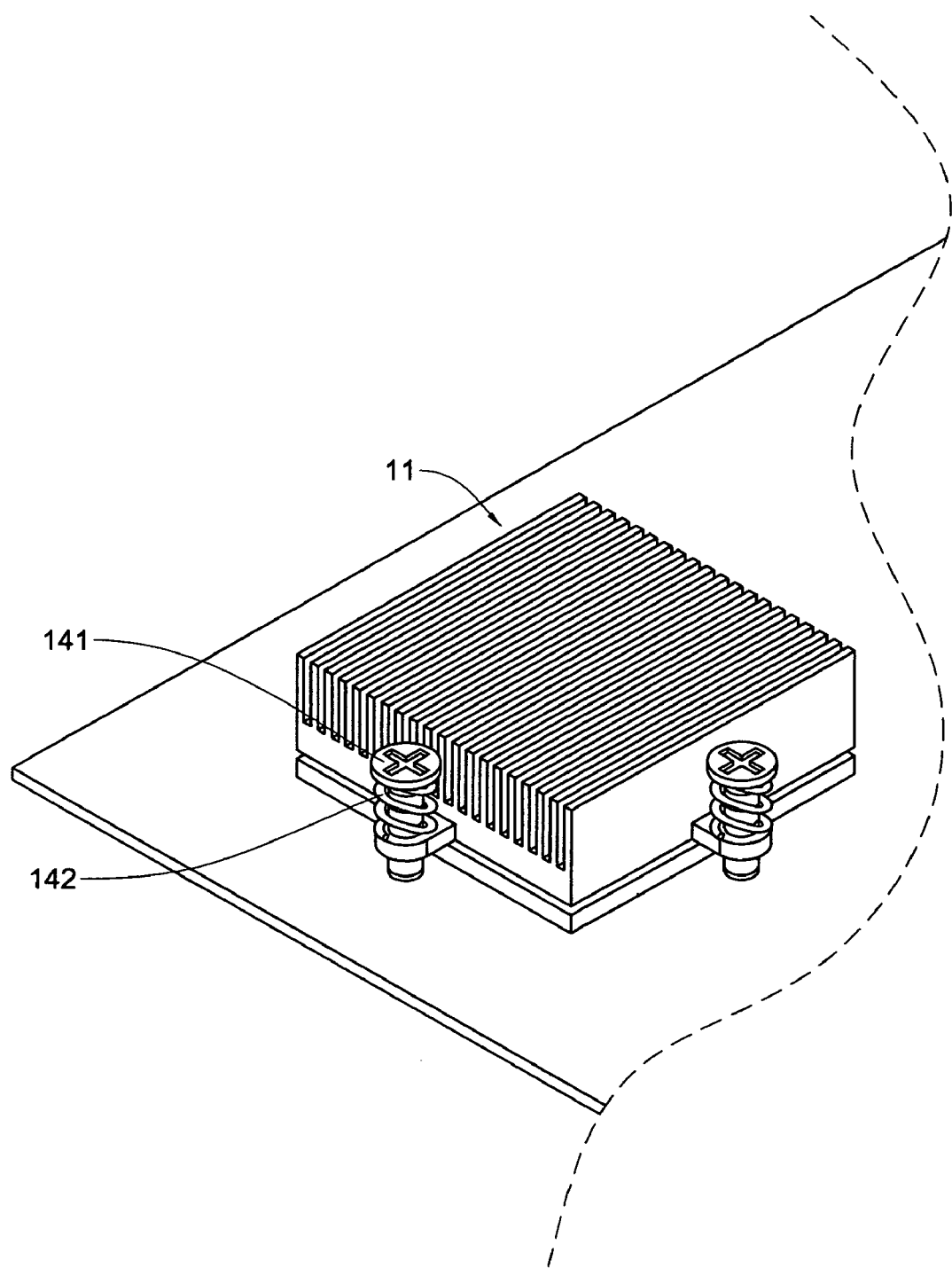
FIG. 2 is an assembled perspective view of the conventional radiator with a securing device.
Figure 3:
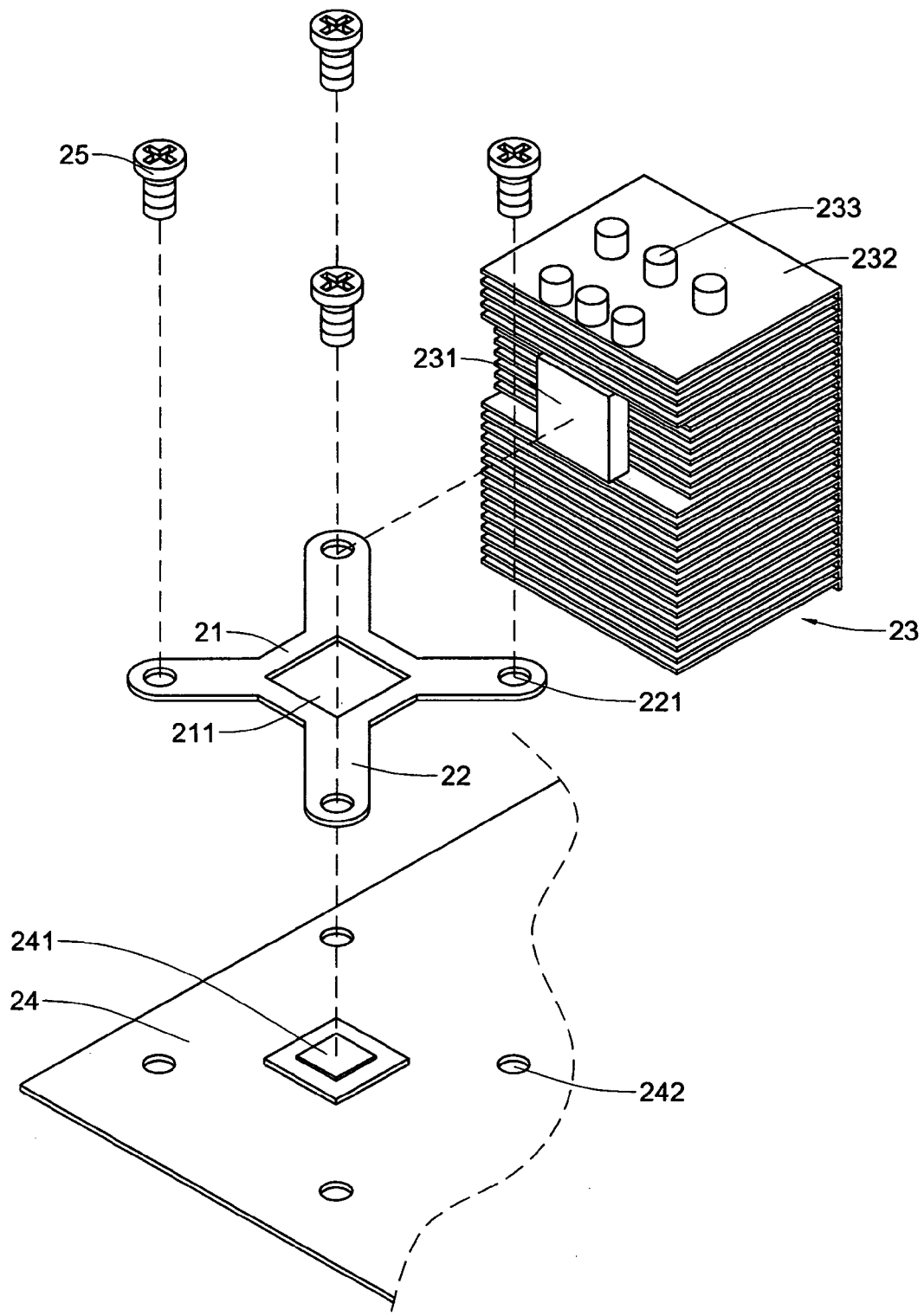
FIG. 3 is a disassembled perspective view of a radiator with a securing device according to the present invention.
Figure 4:
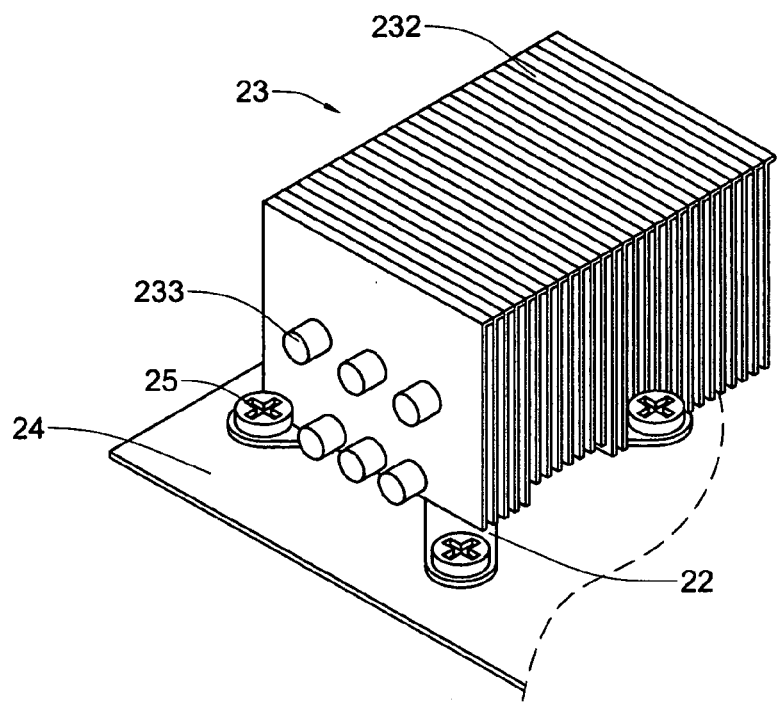
FIG. 4 is an assembled perspective view of the radiator with securing device according to the present invention.

Referring to FIGS. 3 and 4, a radiator with a securing device according to the present invention includes a radiator 23 and a securing device. The radiator 23 is attached to a base plate 24 with a heat generating unit 241 such as a CPU. The securing device has a locating part 21 is disposed under the radiator 23 to support and locate the radiator 23. The locating part 21 has an opening 211, which has a shape and size corresponding to a base 231 at the bottom of the radiator 23. The shape of the opening 211 is a square shape but it is noted that the square opening 211 is only an example and not a restriction. A secure arm 22 extends radially from four corners of the opening 211 respectively and the secure arm 22 has an engaging hole 221 at the outer end thereof. Further, the secure arm 22 is tempered with heat treatment so that the secure arm 22 has a property of elasticity.

The engaging hole 221 is used for being passed through with a fastener 25, which is a screw shown in FIGS. 3 and 4. The base 231 of the radiator is joined with a plurality of cooling fins 232 are fixedly attached to the base 231. Further, a plurality of guide heat pipes 233 penetrate the cooling fins 232 and touch the base 231 horizontally.

When the radiator 23 is secured to the base plate 24, the base 231 of the radiator 23 fits with the opening 211 of the locating part 21 and then the locating part 21 is attached to the base plate 24 with the engaging holes 221 aligning with engaging holes 242 at the base plate 24. The fasteners 25 engage with the engaging holes 221, 242 to allow the radiator 23 is fixedly secured to base plate 24 and the base 231 of the radiator 23 can keep close contact with the heat generating unit 241. In this way, heat from the heat generating unit 241 is transmitted to the radiator 23 properly via the base 231 and heat is dissipated effectively.

Figure 5:
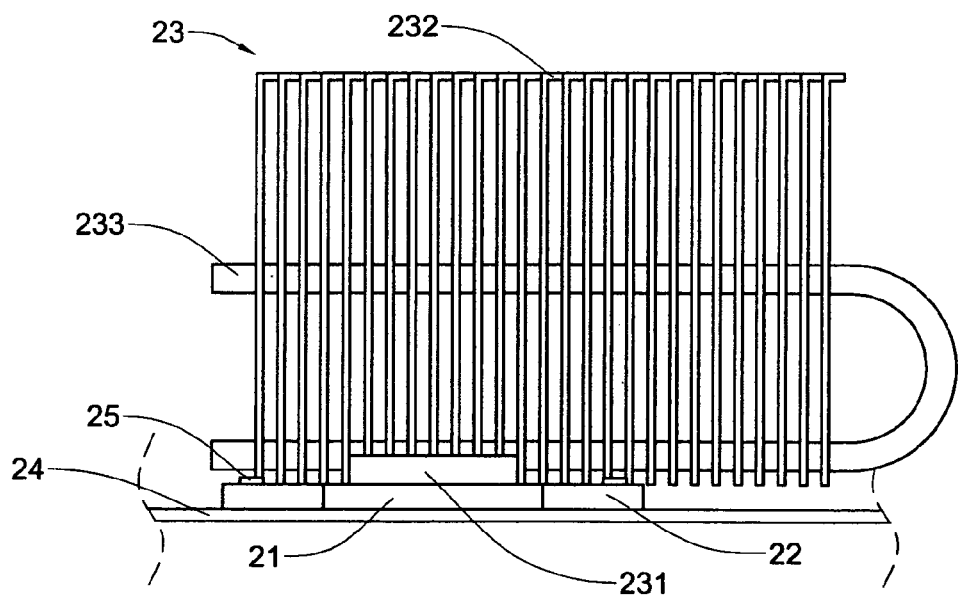
FIG. 5 is a side view of the radiator with a securing device according to the present invention.

Referring to FIGS. 3 and 5, Once the fasteners 25 engage with the locating part 21 and the base plate 24, a resilient contact pressure between the radiator 23 and the heat generating unit 241 due to the secure arms 22 being elastic it is capable of preventing the base plate 24, the secure arms 22 or the heat generating unit 241 from damage resulting from excessive fastening force of the fasteners 25.

Because the locating part 21 is disposed under the radiator 23, structure and shape of the radiator 23 is will not be restricted by the locating part. Further, springs, which are used in the conventional device, are not needed in the present invention while the screws are fastened to secure the radiator. Hence, the production cost can be lowered and the deficiency of missing springs and screws can be overcome.

While the invention has been described with referencing to a preferred embodiment thereof, it is to be understood that modifications or variations may be easily made without departing from the spirit of this invention, which is defined by the appended claims.

What is claimed is:

1. A radiator with a securing device, comprising:

A radiator having a base with a plurality of cooling fins thereon;

A plurality of cooling pipes penetrating the cooling fins transversely and contacting the base;

A base plate having a heat-generating unit fixedly attached to the base plate, and further provided with a plurality of engaging holes;

the securing device comprising a locating part disposed under the radiator, attaching the radiator to the base plate, said locating part being flat and having an opening corresponding with and receiving the base of the radiator and having extending outwardly therefrom a plurality of elastic securing arms each with a fixing hole at an outer end thereof, the fixing holes receiving fasteners attaching the arms to the base plate, such that the base of the radiator is thermally engaged with the heat generating unit to dissipate heat therefrom.

* * * * *